(12) United States Patent
Smith et al.

(10) Patent No.: US 7,362,818 B1
(45) Date of Patent: Apr. 22, 2008

(54) AMPLITUDE AND PHASE COMPARATOR FOR MICROWAVE POWER AMPLIFIER

(75) Inventors: Howard J Smith, Bishop's Stortford (GB); Graham Dolman, Saffron Walden (GB); Scott T Widdowson, Harlow (GB)

(73) Assignee: Nortel Networks Limited, St. Laurent, Quebec (CA)

( * ) Notice: Subject to any disclaimer, the term of this patent is extended or adjusted under 35 U.S.C. 154(b) by 1265 days.

(21) Appl. No.: 09/945,171

(22) Filed: Aug. 30, 2001

(51) Int. Cl.
*H04L 25/49* (2006.01)

(52) U.S. Cl. ..................... 375/296; 375/297

(58) Field of Classification Search ............... 375/297, 375/296, 295, 285; 455/126, 63; 330/149; 327/291; 332/117, 159, 123–128, 106, 107, 332/154–162
See application file for complete search history.

(56) References Cited

U.S. PATENT DOCUMENTS

| | | | | |
|---|---|---|---|---|
| 2,028,511 A * | 1/1936 | Miller | ......................... | 455/267 |
| 2,367,327 A * | 1/1945 | Beers | ......................... | 455/228 |
| 2,900,459 A * | 8/1959 | Olive | ......................... | 330/10 |
| 4,001,886 A * | 1/1977 | Hofste op Bruinink | ....... | 360/75 |
| 4,568,200 A * | 2/1986 | Hatono et al. | ............... | 374/122 |
| 4,700,151 A | 10/1987 | Nagata | ........................ | 332/18 |
| 5,049,832 A | 9/1991 | Cavers | ........................ | 330/149 |
| 5,193,224 A * | 3/1993 | McNicol et al. | ............. | 455/126 |
| 5,396,190 A * | 3/1995 | Murata | ........................ | 330/149 |
| 6,014,058 A * | 1/2000 | Iga | ............................. | 330/279 |
| 6,054,896 A * | 4/2000 | Wright et al. | ................ | 330/149 |
| 6,055,278 A * | 4/2000 | Ho et al. | ..................... | 375/296 |
| 6,160,449 A * | 12/2000 | Klomsdorf et al. | ......... | 330/149 |
| 6,177,786 B1 * | 1/2001 | Shimamori | .................. | 323/283 |
| 6,201,405 B1 * | 3/2001 | Hedberg | ....................... | 326/30 |
| 6,271,977 B1 * | 8/2001 | Chung et al. | ................. | 360/46 |
| 6,275,685 B1 * | 8/2001 | Wessel et al. | ............... | 455/126 |
| 6,304,140 B1 * | 10/2001 | Thron et al. | ................. | 330/149 |
| 6,334,050 B1 * | 12/2001 | Skarby | ........................ | 455/126 |
| 6,396,345 B2 * | 5/2002 | Dolman | ....................... | 330/149 |
| 6,429,736 B1 * | 8/2002 | Parry et al. | .................... | 330/2 |
| 6,437,641 B1 * | 8/2002 | Bar-David | .................... | 330/10 |
| 6,512,417 B2 * | 1/2003 | Booth et al. | ................. | 330/149 |
| 6,560,253 B1 * | 5/2003 | Munks et al. | ................. | 372/32 |
| 6,741,867 B1 * | 5/2004 | Tetsuya | ....................... | 455/522 |
| 2001/0022532 A1 * | 9/2001 | Dolman | ....................... | 330/149 |
| 2001/0054931 A1 * | 12/2001 | Bar-David | .................... | 330/10 |
| 2002/0048326 A1 * | 4/2002 | Sahlman | ...................... | 375/297 |

FOREIGN PATENT DOCUMENTS

EP    1 011 192 A2    6/2000

* cited by examiner

*Primary Examiner*—Tesfladet Bocure
(74) *Attorney, Agent, or Firm*—Barnes & Thornburg LLP

(57) ABSTRACT

A predistortion power amplifier architecture has a power amplifier which receives an input via an amplitude modulator and a phase modulator. A sample of the output of the amplifier and a sample of the input to the amplifier are applied to an adaptive pre-distorter subsystem. The adaptive pre-distorter generates a gain correction signal which is applied to the amplitude modulator and a phase correction signal which is applied to the phase modulator. This serves to predistort the input signal to the power amplifier to compensate for non-linearities in the power amplifier. A switching arrangement alternately couples a sample of the input and output of the amplifier to a first and a second envelope detector. The outputs of the envelope detectors are applied to a difference amplifier. The switching arrangement has a chopping action on the signals which helps to offset imbalances in the characteristics of the two envelope detectors.

17 Claims, 7 Drawing Sheets

Figure 1 – Predistortion PA circuit
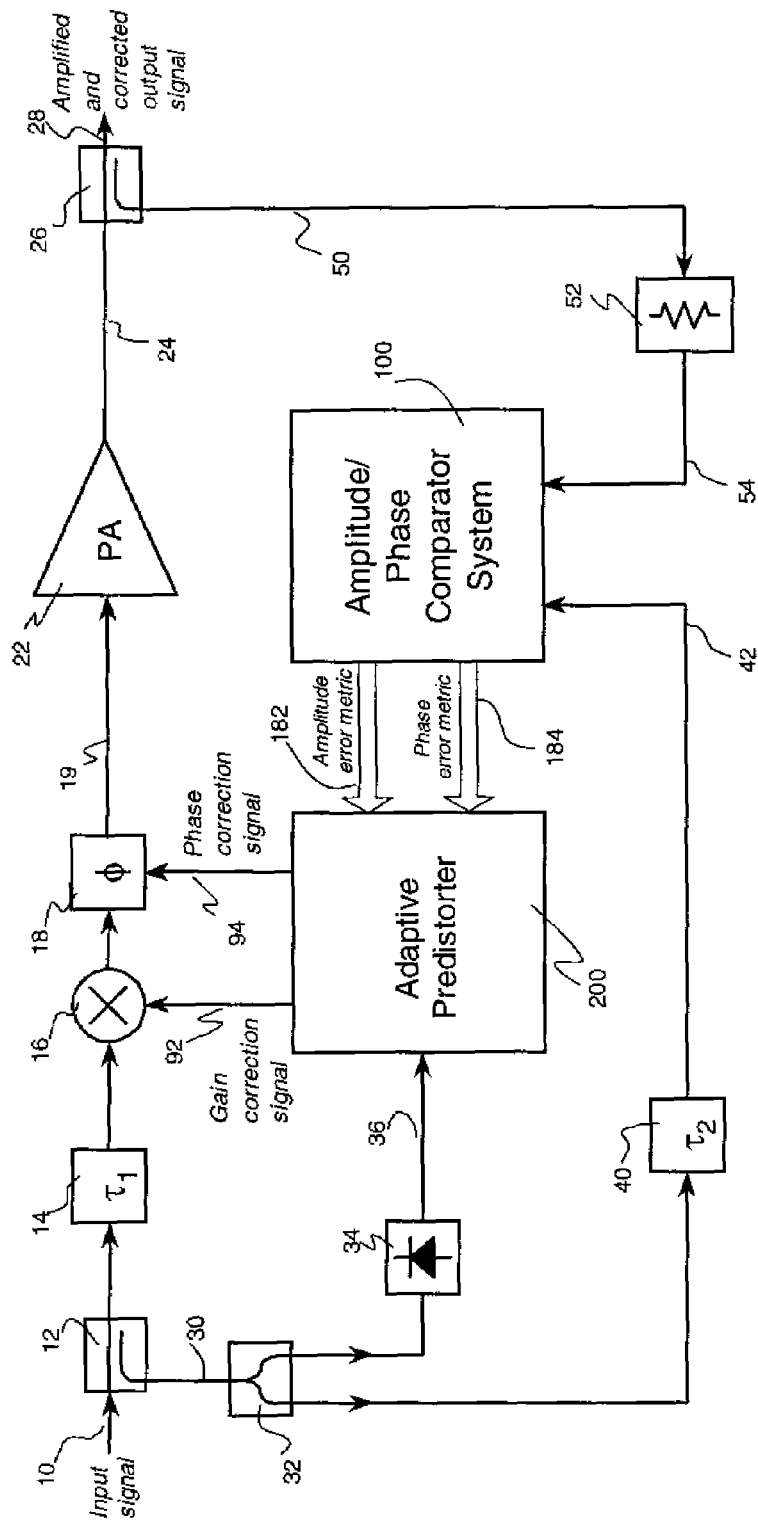

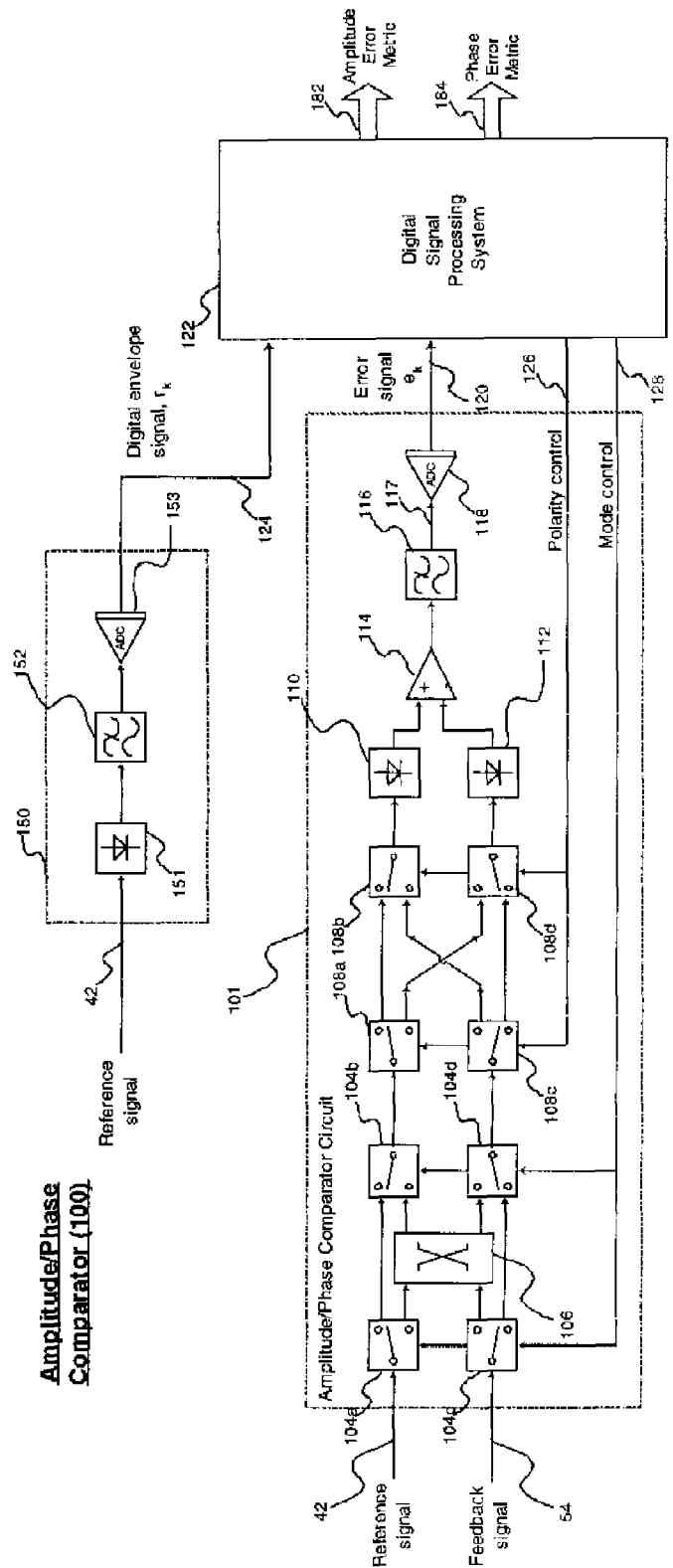
Figure 2 – Amplitude/Phase Comparator circuit (first embodiment)

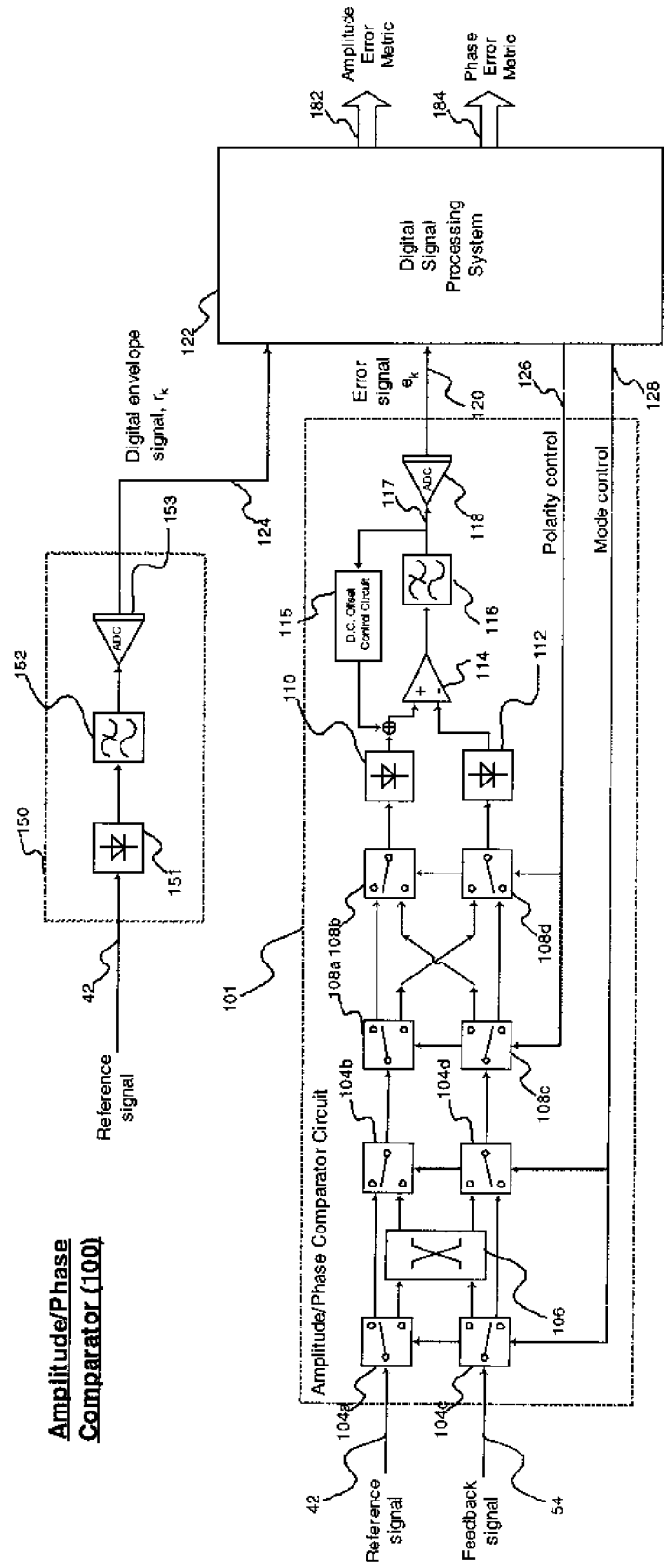
Figure 3 – Amplitude/Phase Comparator circuit (second embodiment)

Figure 4 – Predistortion circuit for use with the present invention
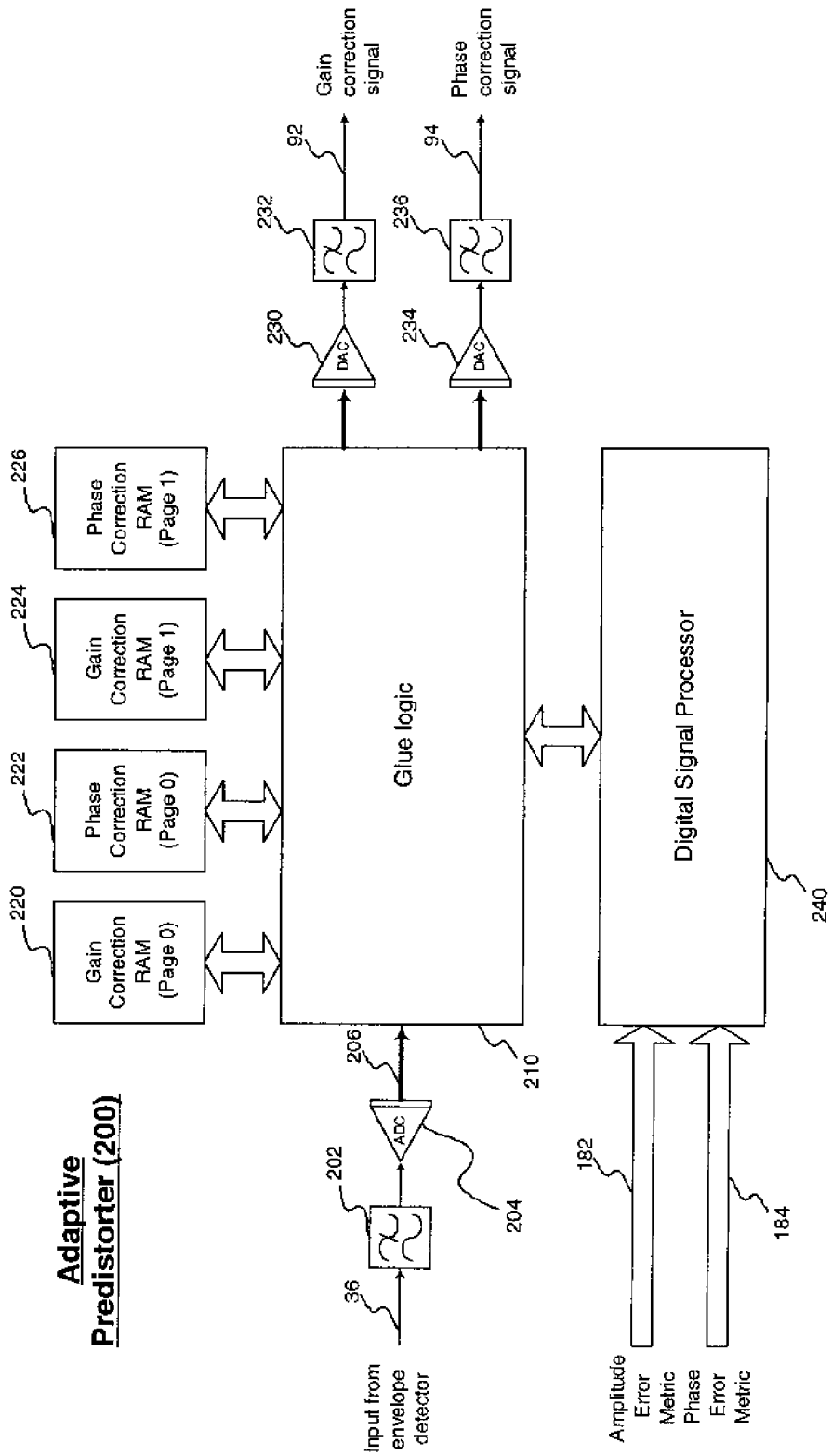

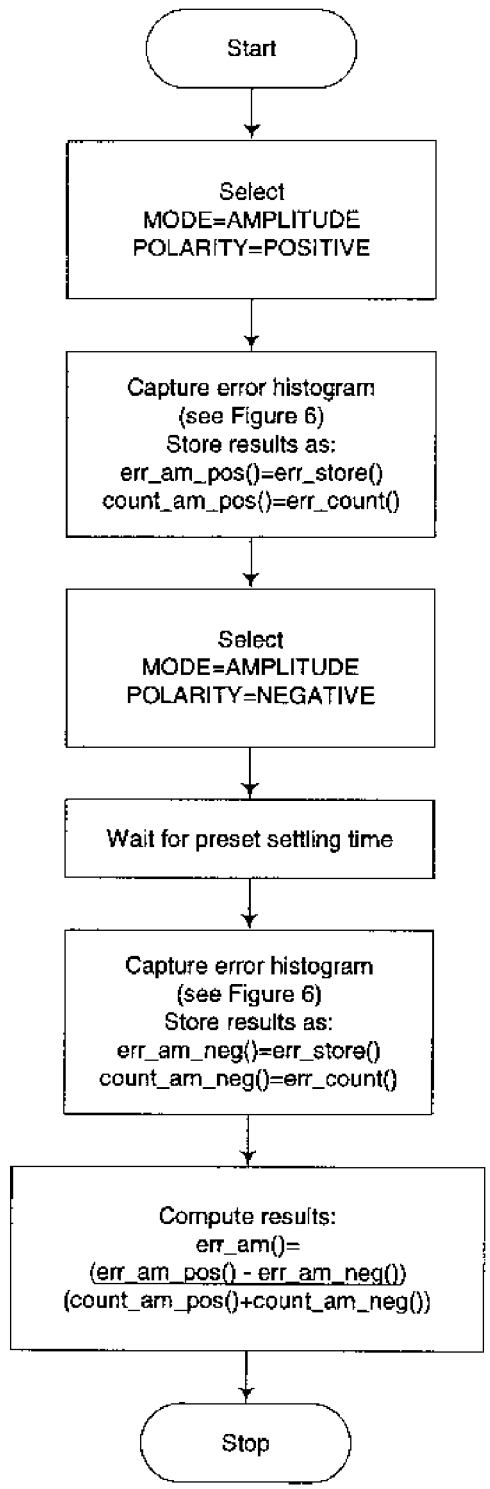
Figure 5 – Magnitude error computation

Figure 6 – Histogram capture computation
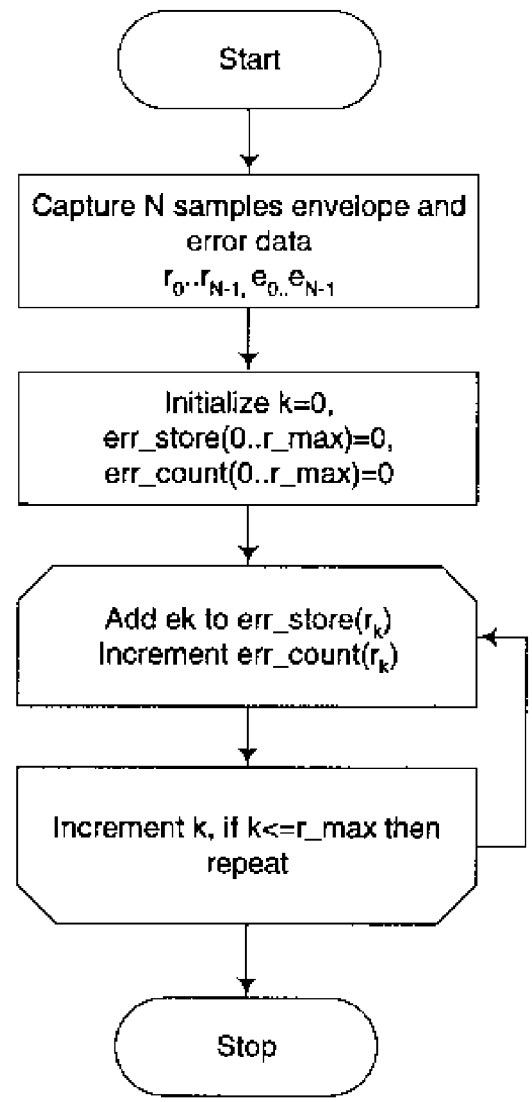

Figure 7 – Phase error computation
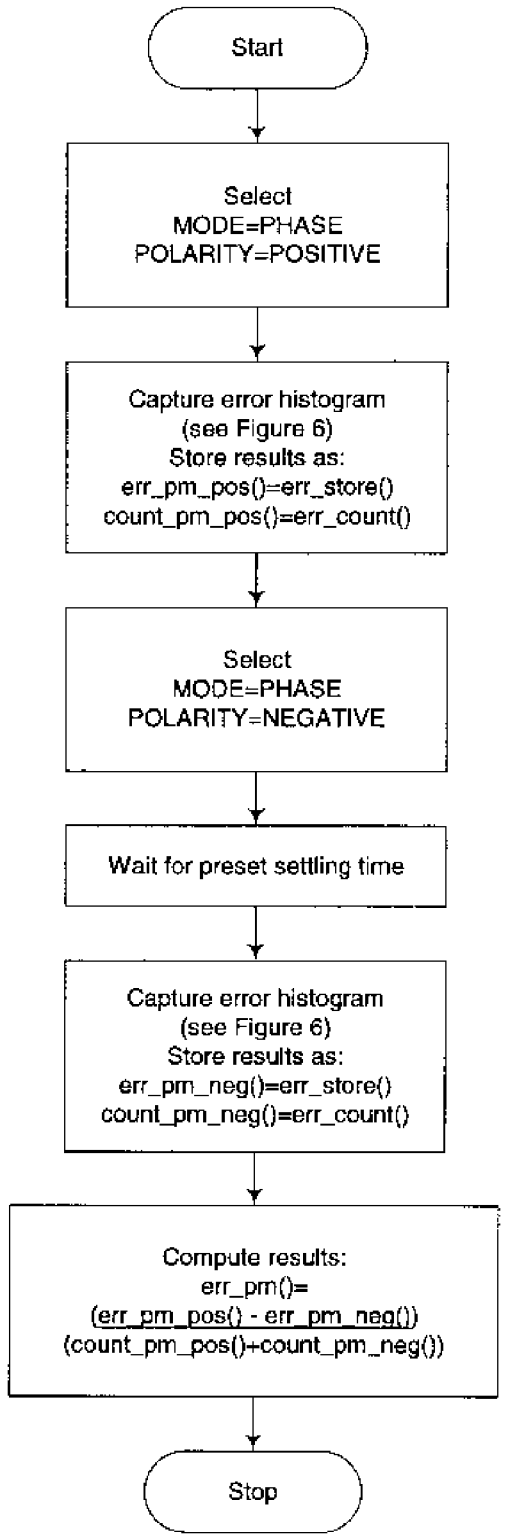

AMPLITUDE AND PHASE COMPARATOR FOR MICROWAVE POWER AMPLIFIER

FIELD OF THE INVENTION

The present invention relates to power amplifiers for communications systems and in particular, though not exclusively, to 3G cellular predistortion power amplifiers. The present invention particularly relates to an improved amplitude and phase comparator for such a power amplifier.

BACKGROUND OF THE INVENTION

As is well known; microwave power amplifiers are non-linear devices whose amplitude and phase transfer function varies depending on a number of factors including input signal level, frequency, temperature, power supply fluctuations and age. Power amplifiers for wireless communications apparatus typically have to operate throughout a large part of their dynamic range, some of which is highly non-linear. These applications therefore mean that the amplifiers are especially prone to some of these factors. This results in a distorted signal output giving rise to the generation of spurious emissions in the adjacent and nearby frequency channels.

The non-linear effects of power amplification on a spread-spectrum modulated signal are particularly pronounced and introduce sidebands, termed 'regrowth sidebands' which are characteristic of amplifier distortion. Regrowth sidebands are a system problem since they can potentially interfere with neighbouring communication channels. Specification limits on regrowth sidebands are therefore stringently specified in most cellular communication standards, including those for the new third generation mobile systems such as UMTS.

Feed-forward linearisation circuitry is typically employed in cellular power amplifiers to adjust the output of the amplifier to compensate for its non-linear characteristics. (Other linearising methods include direct RF feedback and envelope feedback.) A recent advance in this field has been the use of predistortion circuitry which adjusts the much smaller input signal to the amplifier to compensate "in advance" for expected non-linearity in the amplifier. Predistortion amplifiers are less complicated than feedforward amplifiers which require the modification of the separated distortion component in amplitude and phase to match the gain and phase shift of the amplifier on a continuous basis. Feed forward amplifiers also require a separate error amplifier handling similar power levels to the main amplifier which significantly increases the system cost and power consumption. A predistortion arrangement is described in European Patent Publication EP 1 011 192, which corresponds to applicants issued U.S. Pat. No. 6,275,685 issued Aug. 14, 2001 (Wessel). Other predistortion arrangements are described in U.S. Pat. No. 4,700,151 (Nagata) and U.S. Pat. No. 5,049,832 (Cavers).

The predistorter is a signal processing element inserted before the (nonlinear) High Power Amplifier which modifies the input signal with a nonlinearity complimentary to that of the amplifier. On passing through the High Power Amplifier the predistortion sidebands on the modified signal and the distortion products from the amplifier cancel each other, giving a greatly improved output spectrum. This has an advantage over the traditional feedforward linearization architecture in that the signal processing is all carried out on a small signal at the amplifier input, resulting in great savings in cost and power consumption.

However, to achieve more than a few dB reduction in adjacent channel regrowth, the predistorter typically needs to be made adaptive. In this way the predistorter can be continuously adjusted to maintain high performance even as the amplifier response varies with temperature, operating frequency, power supply and aging.

One of the crucial parts of an adaptive predistorter system is a system which estimates the error between the ideal (input) signal and the corrupted system output in order to drive the adaption process. Depending on the characteristics of the signal, estimating this error to the required degree of accuracy is extremely difficult. The performance of the error detector system can in fact be limiting on the level of regrowth suppression achievable.

Wessel also describes such an error detector system, however even higher levels of accuracy are desirable, also Wessel requires the detectors concerned to maintain closely matched performance over power and temperature which may have cost implications. It may also require factory adjustment to optimize spurious performance.

SUMMARY OF THE PRESENT INVENTION

It is an object of the present invention to provide an improved gain and/or phase error detection system for a predistortion power amplifier.

The present invention provides a comparator for an amplifier, the comparator comprising:
  switch means which alternately couples a first and second detector means to the input and output of said amplifier, the amplifier output being normalised to the amplifier input signal level and time aligned,
  difference means arranged to determine an error value corresponding to the difference between said amplifier input and output;
  digital signal processing means arranged to determine said error values as a function of said amplifier input signal level.

Capturing two sets of error signals by alternating between two different circuit component sets, and averaging to minimise the distortion introduced by the non-ideal nature of these components provides a more accurate gain/phase error comparator compared with prior art arrangements for predistortion power amplifier stages. The detector has wide signal bandwidth capability and high accuracy, even with a high dynamic range signal, such as those experienced in CDMA-based wireless communication systems. The invention also provides adjustment free operation and immunity to temperature and aging.

The comparator is a gain, phase or combination comparator.

Preferably the difference means is a difference amplifier coupled to the outputs of said detectors.

Implementing the difference function in the analogue domain is cheaper than doing this in the digital domain, and has been found in practice to provide more accurate results.

Preferably further comprising a DC offset applied to the output of a detector.

Preferably the output of each detector is coupled to the digital signal processing means and the difference means is implemented by the digital signal processing means.

Preferably phase detection comprises a switch matrix having a 90 degree hybrid coupler and arranged to switch the hybrid coupler between said detectors and amplifier such that said error represents phase error.

The DC offset is an important practical improvement which allows the difference or error signal/value to be centred on the middle of the dynamic range of the digitising function by a DC offset control loop.

Preferably said digital signal processing means averages said error values over a predetermined period for each said amplifier input signal level.

Averaging the error values over a predetermined period provides an improved error metric at the output of the comparator, for use by the pre-distorter. This improves the regrowth improvement achievable by the pre-distorter. It also rejects any DC offset applied by the original system.

A further aspect of the present invention provides a comparator and pre-distorter arrangement for an amplifier, the pre-distorter coupled to the input of the amplifier, and the gain/phase comparator coupled to the pre-distorter; the comparator having:

switch means which alternately couples a first and second detector means to the input and output of said amplifier, the amplifier output being normalised to the amplifier input signal level and time aligned, difference means arranged to determine an error value corresponding to the difference between said amplifier input and output;

digital signal processing means arranged to determine said error values as a function of said amplifier input signal level.

Preferably the pre-distorter averages the error values for each said amplifier input signal level.

Preferably the pre-distorter has gain or phase correction memory comprising gain or phase correction values as a function of amplifier input signal level, the pre-distorter being arranged to output said gain or phase correction values dependent on detected amplifier input; the pre-distorter further arranged to adapt said gain or phase correction values dependent on said error values determined by said comparator.

Preferably the pre-distorter further comprises a second gain or phase memory comprising gain or phase correction values as a function of the amplifier input, the pre-distorter arranged to alternately switch between said first and second memory such that one said memory is used to output said correction signal whilst the correction values in the other memory are adapted.

Another aspect of the invention provides a method of determining the gain or phase error between the input and output of an amplifier, the method comprising:

detecting the input and output of said amplifier, the amplifier output having been normalised to the amplifier input and time aligned, wherein the means of detection are alternated between the amplifier input and output;

determining an error value corresponding to the difference between the detected amplifier input and output;

determining error values as a function of amplifier input signal level.

Preferably comprising averaging said error values over a predetermined period.

Another aspect of the invention provides an amplifier having a pre-distorter coupled to the input of the amplifier, and a gain/phase comparator coupled to the pre-distorter; the comparator having:

switch means which alternately couples a first and second detector means to the input and output of said amplifier, the amplifier output being normalised to the amplifier input signal level and time aligned, difference means arranged to determine an error value corresponding to the difference between said amplifier input and output;

digital signal processing means arranged to determine said error values as a function of said amplifier input signal level.

A further aspect of the invention provides a base station comprising an amplifier having a pre-distorter coupled to the input of the amplifier, and a gain/phase comparator coupled to the pre-distorter; the comparator having:

switch means which alternately couples a first and second detector means to the input and output of said amplifier, the amplifier output being normalised to the amplifier input signal level and time aligned, difference means arranged to determine an error value corresponding to the difference between said amplifier input and output;

digital signal processing means arranged to determine said error values as a function of said amplifier input signal level.

BRIEF DESCRIPTION OF THE DRAWINGS

The present invention will now be described with reference to the following drawings, by way of example only and without intending to be limiting, in which:

FIG. 1 is a predistortion power amplifier circuit architecture;

FIG. 2 is a schematic of a comparator or phase/gain error detector arrangement according to a first preferred embodiment of the present invention;

FIG. 3 is a second preferred embodiment circuit arrangement for a gain/phase comparator according to the present invention;

FIG. 4 is a predistortion circuit arrangement suitable according to the present invention;

FIG. 5 is a flowchart showing a method of determining gain error metric according to the present invention;

FIG. 6 is a flowchart of a method of time averaging the gain error metric rate for a given input amplitude; and FIG. 7 is a flow chart of a method of determining the phase error metric.

DETAILED DESCRIPTION

FIG. 1 shows a predistortion power amplifier circuit architecture incorporating a gain/phase comparator (100) and a predistorter (200) according to the present invention. An RF input signal (10) is applied to an input (19) of a high power amplifier (22) via a directional coupler (12), a first delay line (14), an amplitude modulator (16) and a phase modulator (18). The output (24) of the amplifier (22) provides an amplified output signal (28) which is sampled by a directional coupler (26). The sampled RF output (30) from the directional coupler (12) is applied to a power splitter (32), the outputs of which are connected to an envelope detector (34) and a second delay line (40). The output (36) of the envelope detector is connected to an adaptive pre-distorter subsystem (200). The adaptive pre-distorter subsystem (200) generates two outputs: a gain correction signal (92) which is connected to the control port of amplitude modulator (16); and a phase correction signal (94) which is connected to the control port of phase modulator (18).

The adaptive pre-distorter (200) generates the correction signals (92, 94) as functions of input (36) in such a way that the input signal, delayed by (14) and modulated by modulators (16, 18), on passing through the high power amplifier (22) emerges with lower distortion than if no pre-distortion subsystem had been employed. The purpose of the pre-distorter gain and phase transfer functions is therefore to cancel the gain and phase distortion produced in the power amplifier (22). The purpose of delay line (14) is to compensate for any delay skew between the signal (10) modulation and the correction signals (92, 94) induced by processing delay in the correction path (12, 32, 34, 200).

In order to compensate for changes in the high power amplifier (22) gain and phase distortion characteristic, for example due to temperature or channel frequency changes, the pre-distorter (200) operates on an adaptive basis. That is, the pre-distorter (200) adaptively adjusts its gain and phase transfer functions in response to a residual gain error metric (182) and a residual phase error metric (184) fed back from a gain/phase comparator (100).

The amplitude metric (182) takes the form of an array, where for each entry the subscript relates to the input signal envelope and the value relates to the amplitude error between the system input and output. The amplitude metric (182) therefore captures an error metric of the system amplitude response as a function of the input signal envelope. Similarly the phase metric (184) is an array which captures a metric of the system phase response as a function of input signal envelope.

In operation, the pre-distorter adaptively adjusts its amplitude and phase response to try and null all error entries of the arrays (182) and (184) to a zero error condition. The amplifier (22) is then optimally linearized.

The gain/phase comparator system (100) requires as inputs a sample (42) of the input signal (10) and a sample (54) of the output signal (28), normalized to the same signal level and aligned in time. Output sample (54) is normalised to the same level as (42) by attenuating the coupled output (50) of coupler (26) in attenuator (52); input sample (42) is time-aligned with (54) by delaying one output of power splitter (32) in delay line (40).

FIG. 2 shows a schematic diagram of a gain/phase comparator system (100) according to the present invention which is suitable for use with the pre-distorter (200) and pre-distortion power amplifier arrangement of FIGS. 1 and 4. FIGS. 5, 6, 7, are flow charts showing operation of the error detection system or gain/phase comparator (100).

An analogue amplitude and phase comparator circuit (101) of the comparator (100) receives two RF inputs, one sampled from the (ideal) input signal (42) and one sampled from the nonlinear amplifier output (54). The two signals (42, 54) are required to be time aligned at the input to the comparator circuit. The signals (42, 54) are applied to an arrangement of four electronic analogue changeover switches (104a, 104b, 104c, 104d) and a 90° hybrid coupler (106) which splits the signal at each of two inputs in two and distributes the two halves from each input to the two outputs. A hybrid is a well known RF circuit component in which at one output, the signals from the two inputs are combined with a 90° phase lead, whilst at the other output the samples are combined with a 90° phase lag. Such hybrids may be implemented using coupled transmission lines, a structure known as a 'branch line' hybrid, or they may also be implemented using RF transformers. Other implementations known to the skilled person could also be used. The electronic switches are preferably implemented as monolithic GaAs switches or PIN switches.

Depending on the sense of a digital (mode) control signal (128) the switches (104a, 104b, 104c, 104d) may be arranged in one of two configurations. To detect gain errors, said switches are arranged to pass signals (42) and (54) directly to subsequent switches (108a, 108c). To detect phase errors, said switches are arranged to pass them first through a 90° hybrid (106).

The outputs of switches (104b, 104d) are passed to a further arrangement of electronic analogue changeover switches (108a, 108b, 108c, 108d). These are connected in a commutator arrangement so that depending on the sense of a digital (polarity) control signal (126) the outputs of switches (104b) and (104d) may be passed directly to envelope detectors (110) and (112) respectively or may be swapped over before connecting to these detectors.

The two envelope detectors (110, 112) are nominally identical circuits which detect the RF envelope of the signals from switches (108b) and (108c). The resulting baseband signals are fed to a differential amplifier (114) where they are subtracted. The resulting error signal is fed to an analogue-to-digital converter (ADC) (118) via an anti-alias filter (116). The output of the ADC is a sequence of error samples (120), here designated $e_k$, which is captured by a Digital Signal Processing (DSP) system (122).

The use of detectors and a baseband differential amplifier significantly compresses the dynamic range of the signals applied to the DSP part of the comparator compared with modulated signals and hence minimises problems such as clipping which affect the digitising of RF signals. This is also lower cost than alternative schemes involving the digitisation of uncancelled RF signals.

Whilst it is preferred that the subtraction of the baseband signals is done in the analogue domain by a difference amplifier, alternatively the baseband signals could be digitised and coupled to the DSP (122) which is then arranged to subtract them digitally.

The DSP system (122) additionally captures a digital signal (124), designated $r_k$, which is indicative of the amplitude of the input signal (42). This may be generated by a separate circuit (150) comprising an amplitude or envelope detector (151), anti alias function (152) and ADC (153) coupled to the input signal (42) sampled from the amplifier input. Alternatively the digital signal (124) could be supplied directly from the external DSP system (not shown) used to generate the RF signal input (10) to the amplifier. In a further and preferred alternative, the envelope signal (124) is derived from another digitised envelope signal (36) applied to the pre-distorter (200).

The DSP system (122) cycles the amplitude/phase error detector comparator circuit (101) through all four combinations of the polarity (126) and mode (128) control signals. It performs a computation to generate amplitude and phase error metrics (182, 184) which are used by a pre-distorter system (for example 200) to adjust the predistorter response in an amplifier arrangement.

In the amplitude detection mode of the error detector circuit 101, switches 104a, 104b, 104c, 104d are as shown in FIG. 5. The inputs (42), (54) are fed directly (switches 108a, 108b, 108c, 108d as shown), or swapped over (reversed polarity), to amplitude detectors (110) and (112). The error signal (120) is then simply proportional to the difference in the envelope of the input signals (42), (54) assuming ideal envelope detectors (110, 112). Envelope detectors are preferred, although the detection law is non-critical. Wide detection bandwidth is however required.

If we denote the input signals (42), (54) in phasor representation as the vectors r and f respectively then the error signal (120) will be given in the ideal case by:

Error signal $e_k \propto \pm(|r|-|f|)$

The sign of the error depends on the sense of the polarity control (126). In general the responses of the detectors (110, 112) will be non ideal and non-identical, furthermore the differential amplifier (114) will typically have a significant d.c. offset. Therefore a real amplitude error signal will be given by:

Error signal $e_k \propto +(|r|-|f|)+f_1(|r|)-f_2(|f|))$
in one state of signal (126), and
Error signal $e_k \propto -(|r|-|f|)+f_1(|f|)-f_2(|r|))$
in the other state (reverse polarity) of signal (126).

The terms $f_1(|\cdot|)$ and $f_2(|\cdot|)$ are functions of the input envelopes summarizing the offsets, tracking errors and non-ideality of detectors (110, 112).

The DSP (122) captures two sets of error data from the two states of polarity control (126) which results in a dramatic improvement. This is because in a real system the detectors (110, 112) will be non-ideal and non-identical. For each value of signal envelope as determined by signal (124), the DSP subtracts the error data acquired in one state of signal (126) from that acquired in the other state. As $|r|$ is approximately equal to $|f|$ the wanted error term $(|r|-|f|)$ will be reinforced whilst the unwanted error terms due to $f_1(|\cdot|)$ and $f_2(|\cdot|)$ will cancel. In the limit as the predistortion accuracy improves, $|r| \to |f|$ and the effect of $f_1(|\cdot|)$ and $f_2(|\cdot|)$ is eliminated altogether.

If the raw error signal (120) were used directly to drive the adaptation process of the pre-distorter (200), the adaptation will adjust the predistorter response to try and null signal (120) to zero i.e. a flat line. To do this the actual amplitude response between the pre-distorter system input and output $(|r|-|f|)$ will converge to $-(f_1(|r|)+f_2(|f|))$ at all envelope values over the dynamic range of the input signal. The functions $f_1(|r|)$ and $f_2(|f|)$ will therefore impose an unwanted distortion term on the predistorter (200) and degrade its performance.

The improvement in spurious performance due to chopping the polarity of the detector provides rejection of imbalances and offsets throughout the baseband chain from the detectors (110, 112) up to and including those arising in the ADC (118). In particular, the response of detectors (110, 112) need only nominally track over the power envelope sufficient to compress the dynamic range of the error signal (120) to a manageable amount such that there is no clipping of the ADC. If the detectors do not approximately track, even in the converged condition when (42) and (54) are identical, the raw error signal (117) may have a high signal level and clip the ADC (118). If ADC (118) clips then information has been lost and the performance will be severely degraded. Provided the detectors track closely enough to keep error signal (117) small, then signal (117) will be faithfully digitised and the spurious error due to the detectors not tracking perfectly will be cancelled by the digital averaging of the positive and negative captures.

Without the chopping action or polarity switching, if the baseband circuits are not perfectly balanced it may be necessary to adjust an aiming point in the adaptation loop of the pre-distorter (200) to optimize the performance of the amplitude/phase detector. With the chopping action in place, the best aiming point is automatically zero and the need for an adjustment is eliminated.

To select phase operation, control signal (128) is set to the opposite state to that used for amplitude. This inserts hybrid (106) between signals (42), (54) and the commutating arrangement (108a, 108b, 108c, 108d). It can be shown that if the amplitude distortion is perfectly corrected so that $|r|=|f|$, then the error signal (120) assuming ideal linear detectors is then Error signal $e_k$ $|r|.(\sqrt{(1+\sin(\frac{1}{2}(\angle r - \angle f)))} - \sqrt{(1-\sin(\frac{1}{2}(\angle r - \angle f)))})$ This function is periodic with respect to the phase error $(\angle r - \angle f)$, and has a period of $2\pi$ with a positive-going zero crossing at $(\angle r - \angle f)=0$ and a negative-going zero crossing at $(\angle r - \angle f)=\pi$. Although it scales linearly with $|r|$, as the zero crossing points where $e_k=0$ depend only on the phase error $(\angle r - \angle f)$, it is a perfectly adequate error signal if all we wish to know is when the two inputs have the same phase.

As the phase adaptation loop (explained in more detail below) of the pre-distorter (200) operates to drive signal (120) to zero over the full envelope range then the system will converge when the dynamic phase error $(\angle r - \angle f)$ between the system input and output is constant at zero or $\pi$ radians (depending on the sign of the adaptation loop). In this condition the phase response is perfectly linearized. The dependency of the error signal on the input signal envelope $|r|$ will effect the transient response of the adaptation loop, however it will not affect the phase relationship at which the error detector 101 or comparator indicates a zero phase error. If detectors (10, 12) are implemented as square law detectors, a somewhat simpler error function $e_k \propto |r|^2 .\sin(\angle r - \angle f)$ results. The architecture chosen functions just as well if this is the case.

Analogous to the amplitude detector, imbalances and offsets in the detectors (101, 112) and baseband circuitry will result in error terms which degrade the accuracy of the phase comparator. By inverting the polarity of the detection circuit (101) and applying an appropriate computation these error terms can again be cancelled to provide an improved phase metric.

There is an additional advantage of this architecture. In implementing a basic amplitude/phase comparator circuit, if a very high amount of baseband gain is required it may prove difficult to stop temperature dependent offsets in the differential amplifier (114) being amplified up and overdriving the ADC (118). As the improved amplitude/phase comparator (101) inherently suppresses offsets in the baseband circuitry, it is possible to add an active d.c. offset control circuit as shown in FIG. 3. The indeterminate analogue d.c. offset added by the control circuit (115) is rejected by the chopping action of the detector, whereas in a simple detector it would fatally degrade the accuracy of the circuit. The advantage of applying the DC offset is that it allows the DC level of the error signal (117) to be centred by active control within the operating range of the ADC (118). This reduces clipping and eliminates the impact of other offsets in the differential amplifier (114) which may change over time with temperature for example.

The DSP (122) can be simply used to receive the incoming error signal (120) and average the positive and negative polarity error signals $e_k$ for each of amplitude and phase modes of comparator circuit (101), to provide amplitude and phase error metric signals (182, 184) which are substantially independent of non-ideal factors in the error detector circuit (101). Flowcharts in FIGS. 5, 6 and 7 show a preferred algorithm and are described in more detail below. The chopping rate for both polarity and mode control is not critical, but the rate should be much lower than the signal bandwidth so that good coverage of the signal envelope values is achieved on each capture.

The invention provides that the DSP (122) processes the error data captured from the error comparator circuit (101) to produce improved amplitude and phase error metrics. These metrics consist of stored arrays of averaged and corrected amplitude and phase errors where the index of the arrays relates to the envelope of the signal.

Prior to processing, the approximate error signal (120) and envelope signal (124) are required to be time aligned by application of appropriate delay elements if necessary.

The envelope signal (124) is quantized to produce a sequence of indices $r_k$ from 0 to a maximum value r_max. These indices correspond to values of the input signal amplitude envelope at which the average amplitude and phase error due to distortion in the amplifier system is to be evaluated.

To process the amplitude error data, the DSP system (122) executes the process shown in FIGS. 5 and 6. A set of N samples of error data is captured, sorted by envelope, accumulated and stored as shown in the histogram capture process of FIG. 6. The polarity of the comparator circuit (101) is toggled and another set of error data is captured, accumulated and stored. It has been found that a sample number (N) of 24000 works well in practice.

For each value of the envelope index ($r_k$), the sum of the stored negative signed errors from the second capture is subtracted from the sum of the positive signed errors from the first capture. The result is then divided by the total error count from both captures. This gives an estimate of the average amplitude error at the envelope value corresponding to that index which is corrected for systematic offsets and nonlinearities arising in the detector circuit (101). If the total count for a particular envelope value is zero, then the result of the 0÷0 calculation should be taken as zero.

For phase detection, a similar process is used: as shown in FIG. 7.

The outputs of the comparator system are the error metric arrays here denoted as:

Amplitude metric: err_am(r)

Phase metric: err_pm(r)

where r is an index relating to the signal envelope, limits are 0 to r_max.

In practice it has been found that an acceptable process rate is where the whole positive capture-negative capture-average-adapt process occurs approximately every 2 msec. Alternate 2 msec updates are used for updating the magnitude and phase correction. The optimal rates will depend on signal type and amplifier characteristics, as well as the DSP used.

Whilst the described capture sequence is:

Amplitude, positive polarity

Amplitude, negative polarity

Phase, positive polarity

Phase, negative polarity, it will be understood that variations of this sequence could also be used. The preferred algorithm computes the final metric for each envelope index as:

$$\text{Error metric} = \frac{\{\text{sum of positive signed errors}\} - \{\text{sum of negative signed errors}\}}{\{\text{sum of error count from both captures}\}}$$

This ensures that each sample of error information has an equal 'weight' in the final metric, for a given envelope.

It is also possible to average the positive and negative signed errors individually, and then average the two together:

$$\text{Error metric} = 0.5 * \left( \frac{\{\text{sum of positive signed errors}\}}{\{\text{positive error count}\}} - \frac{\{\text{sum of negative signed errors}\}}{\{\text{negative error count}\}} \right)$$

(In both cases the divisions have to be done intelligently, to resolve any 0÷0 calculations to give a result of zero.)

In the case of the second calculation, the key benefits of the comparator in rejecting offsets and detector nonlinearity are still realized so long as a large error count is achieved for both the positive and negative error captures. However, if the error count at a particular envelope index were (for example) 4 for the positive capture but only 1 for the negative capture, then the negative error data sample would be weighted four times higher than each of the 4 positive error samples. In the presence of any patterning effects in the data (such that for some indices, a positive error capture consistently scores a higher or lower count than the negative capture a fixed interval later) this would compromise detector accuracy.

Another variation of the above involves using a piece of error data for adaptation only if a non-zero count is achieved on both positive and negative captures. This guarantees at least some cancellation of offset/nonlinearity on all error data used. However, in low-probability regions of the signal probability density function, imposing this condition does greatly decrease the update rate achievable.

Depending on the adaptation algorithm which uses the metrics, another possibility is to let the adaptation algorithm itself combine the positive and negative error captures. In this case, on one adaptation cycle of the predistorter, the amplitude/phase comparator captures a positive polarity set of error data, divides the sum of errors at each index by the corresponding count, and passes the result to the adaptation system. On the next cycle of adaptation, the amplitude/phase comparator captures a negative polarity set of data, divides the sums of errors by their corresponding counts, and inverts the data before passing it to the adaptation. The positive and negative error samples are then averaged by the adaptation process. For a look-up table (LUT) based predistorter this works well, however it increases the level of noise injected into each bin of the lookup table.

An advantage of averaging in the lookup table is that positive and negative captures could be scheduled on a pseudorandom basis, arranged so that the average number of positive captures is equal to the average number of negative captures. This would reduce susceptibility of the offset/nonlinearity calculation to any data pattern-dependent effects.

A further alternative when processing the errors is to accumulate the error histograms on a rolling basis, rather than resetting each envelope value to zero on each capture. A wide variety of options are possible, these then introduce a time constant into the comparator system but do have the advantage of further reducing the noise on the output error metrics.

All of these methods are feasible, and exhibit a range of different strengths and weaknesses. They all however result in (a) the error data acquired being digitally averaged somewhere in the system (b) combination of data from positive and negative polarity modes of the analogue comparator circuit to, suppress offsets and detector nonlinearity/non-tracking.

Both the amplitude and phase modes of the comparator (101) have a response approximately proportional to |r|, assuming the detectors (110, 112) are linear with envelope voltage. Whilst this does not affect the detection of a zero error condition, it will affect the transient behaviour of the predistorter adaptation over the signal envelope range as it converges.

A further alternative to optimise the adaptation process is in normalizing the error metrics, i.e. dividing the errors by |r| (at least approximately) to make the error functions independent of envelope to first order.

With the chopped detector (101) described above, the very good intrinsic suppression of d.c. offset makes normalization of the error metric much more feasible. One possibility is to compute the error metric for envelope of index r as follows:

$$\text{Error metric} = \frac{\{\text{sum of positive signed errors}\} - \{\text{sum of negative signed errors}\}}{r^*\{\text{sum of error count from both captures}\}}$$

The DSP is preferably implemented using high speed digital hardware e.g. FPGA (Field Programmable Gate Array) or an ASIC to capture the error data. The averaging and generation of the outputs could be done by a microprocessor, off-the-shelf DSP chip or by more hardwired logic (FPGA/ASIC).

FIG. 4 shows a preferred implementation of an Adaptive Predistorter (200). Preferably this is used in combination with the preferred implementations of the comparator (100) described above.

Envelope signal (36) is digitised by an anti-alias filter (202) and ADC (204) to produce a digital envelope signal (206). This is used as an address to access Random-Access Memories (RAMs) (220, 222, 224, 226) under the control of glue or access control logic (210).

Random-Access Memories (220) and (222) contain gain and phase correction values respectively which vary as a function of address. As the digital envelope signal (206) varies, the output of RAMs (220) and (222) constitute correction waveforms which, under control of glue logic (210) are applied to DACs (230) and (234). The resulting waveforms are filtered by anti-alias filters (232) and (236) to produce the analogue gain and phase correction signals (92) and (94). In this way, subject to the appropriate values being in RAMs (220) and (222) the Adaptive Predistorter system (200) can generate the required correction signals (92) and (94) to predistort the high power amplifier (22) in FIG. 1.

The gain and phase correction functions used by RAMs (220), (222) to generate the correction signals (92), (94) are arrays of correction values here designated am_lut(r) and pm_lut(r) where the index r relates to the input envelope corresponding to each correction value, and has the same relationship to envelope as the subscript of metrics err_am( ) (182) and err_pm( ) (184). The arrays am_lut(r) and pm_lut(r) may be initialized to near-optimum curves based on a-priori knowledge of the amplifier (22) characteristics or simply set to mid-scale values.

The master copies of am_lut(r) and pm_lut(r) are stored in the workspace of Digital Signal Processor (DSP) (240). They are adapted iteratively using metrics (182), (184) and written out to RAMs (220), (222) as follows.

The DSP (240) captures the amplitude error metric err_am(r) (182). It then updates am_lut as follows:

$$\text{am\_lut}(r) \rightarrow \text{am\_lut}(r) - \mu_g * \text{err\_am}(r)$$

for each value of r. $\mu_g$ is a convergence parameter, which may or may not be a function of r. The updated am_lut(r) is then written to RAM (220) under control of glue logic (210).

The phase RAM (222) is updated in a similar way. The DSP (240) captures the phase error metric err_pm(r) (184). It then updates pm_lut as follows:

$$\text{pm\_lut}(r) \rightarrow \text{pm\_lut}(r) - \mu_p * \text{err\_pm}(r)$$

for each value of r. $\mu_p$ is a convergence parameter, which may or may not be a function of r. The updated pm_lut(r) is then written to RAM (222) under control of glue logic (210).

Due to the large amount of data which needs to be written to RAMs (220),(222) from the DSP (240) during an adaptation cycle, the RAMs (220), (222) are unfortunately unavailable for generating correction signals (92) and (94) whilst this goes on. This may be overcome by adding further gain and phase RAMs (224) and (226). Under control of the glue logic, either gain correction RAM (220) or (224) may be selected to generate correction signal (92). Whichever RAM is not currently selected for generating signal (92) is available to be updated from DSP (210). On each adaptation cycle, the DSP (210) updates its master copy of am_lut(r) and writes it to either RAM (220) or RAM (224) on alternate adaptation cycles. DSP (240) then sends a command to glue logic (210) to swap the two RAMs (220) and (224). The glue logic (210) then swaps the RAMs (220), (224) between read accesses in order to avoid glitching the correction signal (92).

Similarly, phase RAMs (222) and (226) are alternately used for generating phase correction signal (94) and for receiving an update from DSP (240). They are also swapped by glue logic (210) without glitching the correction signal (94).

As discussed in a variation described above, the comparator (100) may be configured to first provide an average of the positive errors as a function of the amplifier input which are used to directly adapt the gain/phase correction values in the pre-distorter (200). The system (100) then provides the corresponding negative errors which are then used to further directly adapt the correction values. The system may be configured such that the RAM is not switched until the same number of positive and negative error adaptions have taken place.

Whilst the preferred comparator (100) has been described as advantageously working with the preferred pre-distorter (200), they may also be used separately with other pre-distorters and comparators.

The architecture of comparator (100) may also be advantageously used with other methods of phase detection having a differential output.

The present invention has been described with reference to preferred embodiments thereof. Alterations and modifications as would be obvious to those skilled in the art are intended to be incorporated within the scope hereof.

The invention claimed is:

1. A comparator for an amplifier, the comparator comprising:
   switch means which alternately (i) couples a first detector to the input of said amplifier and a second detector to the output of said amplifier and (ii) couples the first detector to the output of said amplifier and the second detector to the input of said amplifier, the amplifier output having been normalised to the amplifier input signal level and time aligned, difference means arranged to determine an error value corresponding to the difference between said amplifier input and output;

digital signal processing means arranged to determine said error value as a function of said amplifier input signal level.

2. A comparator as claimed in claim 1 wherein the difference means is a difference amplifier coupled to an output of said first detector and an output of said second detector.

3. A comparator as claimed in claim 2 further comprising a DC offset applied to the output of one of said first detector and said second detector.

4. A comparator as claimed in claim 1 wherein an output of said first detector and an output of said second detector are coupled to the digital signal processing means and the difference means is implemented by the digital signal processing means.

5. A comparator as claimed in claim 1 wherein the switch means further comprises a 90 degree hybrid coupler and the comparator is operable in a phase detection mode in which the switch means couples the 90 degree hybrid coupler between said detectors and said amplifier input and said amplifier output such that said error represents phase error.

6. A comparator as claimed in claim 1 wherein said difference means is arranged to determine a plurality of error values and said digital signal processing means averages said plurality of error values over a predetermined period for each said amplifier input signal level.

7. A comparator and pre-distorter arrangement for an amplifier, the pre-distorter coupled to the input of the amplifier, and a gain/phase comparator coupled to the pre-distorter, the comparator having:
switch means which alternately (i) couples a first detector to the input of said amplifier and a second detector to the output of said amplifier and (ii) couples the first detector to the output of said amplifier and the second detector to the input of said amplifier, the amplifier output having been normalised to the amplifier input signal level and time aligned, difference means arranged to determine an error value corresponding to the difference between said amplifier input and output;

digital signal processing means arranged to determine said error value as a function of said amplifier input signal level.

8. An arrangement as claimed in claim 7 wherein the difference means is arranged to determine a plurality of error values and the pre-distorter averages the plurality of error values for each said amplifier input signal level.

9. A comparator and pre-distorter arrangement for an amplifier, the pre-distorter coupled to the input of the amplifier, and a gain/phase comparator coupled to the pre-distorter, the comparator having:
switch means which alternately (i) couples a first detector to the input of said amplifier and a second detector to the output of said amplifier and (ii) couples the first detector to the output of said amplifier and the second detector to the input of said amplifier, the amplifier output having been normalised to the amplifier input signal level and time aligned, difference means arranged to determine an error value corresponding to the difference between said amplifier input and output;

digital signal processing means arranged to determine said error value as a function of said amplifier input signal level and wherein the pre-distorter has gain or phase correction memory comprising gain or phase correction values as a function of amplifier input signal level, the pre-distorter being arranged to output said gain or phase correction values dependent on detected amplifier input; the pre-distorter further arranged to adapt said gain or phase correction values dependent on said error value determined by said comparator.

10. An arrangement as claimed in claim 9 wherein the pre-distorter further comprises a second gain or phase memory comprising gain or phase correction values as a function of the amplifier input, the pre-distorter arranged to alternately switch between said first and second memory such that one said memory is used to output said correction signal whilst the correction values in the other memory are adapted.

11. A method of determining the gain or phase error between the input and output of an amplifier, the method comprising:
detecting the input and output of said amplifier by alternately (i) coupling a first detector to the input of said amplifier and a second detector to the output of said amplifier and (ii) coupling the first detector to the output of said amplifier and the second detector to the input of said amplifier, the amplifier output having been normalised to the amplifier input and time aligned, determining an error value corresponding to the difference between the detected amplifier input and output;

determining said error value as a function of amplifier input signal level.

12. A method as claimed in claim 11 further comprising determining a plurality of error values and averaging said error values over a predetermined period.

13. A method as claimed in claim 11 further comprising applying a DC offset to the output of one of said first detector and said second detector.

14. A method as claimed in claim 11 further comprising a preliminary step of applying the amplifier output and the amplifier input to a 90 degree hybrid coupler so that the determined error value is a phase error.

15. A method as claimed in claim 11 further comprising determining a gain or phase correction value by using a look up table stored in a first memory, the method further comprising adapting a set of stored gain or phase correction values stored in a second memory dependent on said determined error value and alternately switching between the first memory and the second memory such that one of said memories is used to output said correction value, whilst the correction values in the other memory are adapted.

16. An amplifier having a pre-distorter coupled to the input of the amplifier, and a gain/phase comparator coupled to the pre-distorter, the comparator having:
switch means which alternately (i) couples a first detector to the input of said amplifier and a second detector to the output of said amplifier and (ii) couples the first detector to the output of said amplifier and the second detector to the input of said amplifier, the amplifier output having been normalised to the amplifier input signal level and time aligned, difference means arranged to determine an error value corresponding to the difference between said amplifier input and output;

digital signal processing means arranged to determine said error value as a function of said amplifier input signal level.

17. A base station comprising an amplifier having a pre-distorter coupled to the input of the amplifier, and a gain/phase comparator coupled to the pre-distorter; the comparator having:

switch means which alternately (i) couples a first detector to the input of said amplifier and a second detector to the output of said amplifier and (ii) couples the first detector to the output of said amplifier and the second detector to the input of said amplifier, the amplifier output having been normalised to the amplifier input signal level and time aligned, difference means arranged to determine an error value corresponding to the difference between said amplifier input and output;

digital signal processing means arranged to determine said error value as a function of said amplifier input signal level.

* * * * *